(12) United States Patent
Hashimoto et al.

(10) Patent No.: US 9,245,784 B2
(45) Date of Patent: Jan. 26, 2016

(54) SUBSTRATE RETAINING DEVICE WITH PUSH BACK PORTION

(71) Applicant: KAWASAKI JUKOGYO KABUSHIKI KAISHA, Kobe-shi, Hyogo (JP)

(72) Inventors: Yasuhiko Hashimoto, Kobe (JP); Takayuki Fukushima, Takarazuka (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 0 days.

(21) Appl. No.: 14/369,382

(22) PCT Filed: Dec. 18, 2012

(86) PCT No.: PCT/JP2012/008086
§ 371 (c)(1),
(2) Date: Jun. 27, 2014

(87) PCT Pub. No.: WO2013/099154
PCT Pub. Date: Jul. 4, 2013

(65) Prior Publication Data
US 2015/0016935 A1    Jan. 15, 2015

(30) Foreign Application Priority Data

Dec. 27, 2011    (JP) ................................ 2011-284825

(51) Int. Cl.
| H01L 21/677 | (2006.01) |
| B25J 9/00 | (2006.01) |
| B25J 15/00 | (2006.01) |
| H01L 21/687 | (2006.01) |

(52) U.S. Cl.
CPC ........... *H01L 21/67742* (2013.01); *B25J 9/009* (2013.01); *B25J 9/0084* (2013.01); *B25J 15/0052* (2013.01); *H01L 21/67781* (2013.01); *H01L 21/68707* (2013.01)

(58) Field of Classification Search
CPC ...... B25J 9/0084; B25J 9/009; B25J 15/0052; B25J 18/025; H01L 21/67781; 21/67754; H01L 21/68707; H01L 21/67742
See application file for complete search history.

(56) References Cited

U.S. PATENT DOCUMENTS

2014/0210224 A1 *    7/2014    Hashimoto et al. ............. 901/30

FOREIGN PATENT DOCUMENTS

| JP | 2006313865 A | * | 11/2006 |
| JP | A-2006-313865 | | 11/2006 |
| JP | 2010179419 A | * | 8/2010 |
| JP | 2010179420 A | * | 8/2010 |

* cited by examiner

*Primary Examiner* — Gerald McClain
(74) *Attorney, Agent, or Firm* — Oliff PLC

(57) ABSTRACT

A substrate retaining device comprising: a support mechanism configured to change a pitch at which a plurality of substrate retaining units are arranged, urging mechanisms provided for the respective substrate retaining units and configured to urge the movable units to cause movable retaining members to press-hold substrates, and a push back mechanism configured to release the press-holding of the substrates by the movable retaining members. A push back portion of the push back mechanism is positioned at a standby position, at which the push back portion makes no contact with the movable units.

7 Claims, 9 Drawing Sheets

SUBSTRATE RETAINING DEVICE WITH PUSH BACK PORTION

TECHNICAL FIELD

The present invention relates to substrate retaining devices for retaining substrates such as silicon wafers.

BACKGROUND ART

Conventionally, there are known substrate retaining devices that are capable of in semiconductor processing or the like, transferring a plurality of substrates from a cassette case, the cassette case storing substrates such as silicon wafers in such a manner that the substrates are arranged in their thickness direction at a predetermined pitch, to another cassette case at one time. In particular, there is a known substrate retaining device that is capable of, when transferring the substrates, changing the pitch between the substrates if such a pitch change becomes necessary in relation to the previous or following processing step (see Patent Literature 1, for example).

The substrate retaining device includes: a plurality of substrate retaining parts each including three or more claw portions configured to hold the edge of a substrate; a pitch-changing mechanism configured to change the pitch between the substrate retaining parts; steel tapes each having a bent middle portion and each having one end connected to a corresponding one of the claw portions; and drivers to which the other ends of the steel tapes are connected, the drivers being configured to make reciprocating movement in a direction from the edge toward the center of the substrate. When the pitch-changing mechanism changes the pitch between the substrate retaining parts, the straight-line distance between both ends of the steel tapes changes, accordingly. As a result, the steel tapes become warped. Even in such a case, elasticity generated by the bent portions of the steel tapes absorbs the warp of the steel tapes, and thereby substrate holding force is kept constant.

CITATION LIST

Patent Literature

PTL 1: Japanese Laid-Open Patent Application Publication No. 2006-313865

SUMMARY OF INVENTION

Technical Problem

In substrate retaining devices such as one configured to greatly change the pitch between the substrate retaining parts, or one including an increased number of substrate retaining parts, there is a case where, when the pitch is changed, the straight-line distance between both ends of the steel tapes of some of the substrate retaining parts changes significantly before and after the pitch change, consequently causing the steel tapes to warp significantly. In such a case, it is difficult to keep the substrate holding force constant by absorbing the warp of the steel tapes with the elasticity of the bent portions of the steel tapes.

The present invention has been made to solve the above-described problems. An object of the present invention is to provide a substrate retaining device that is capable of keeping the substrate holding force constant and securely retaining the substrates even in cases where the pitch between the substrate retaining parts is changed greatly or the number of substrate retaining parts is increased.

Solution to Problem

In order to solve the above-described problems, a substrate retaining device according to the present invention includes: a plurality of substrate retaining units; a support mechanism configured to support the plurality of substrate retaining units such that the substrate retaining units are arranged in a first direction, and change a pitch in the first direction at which the plurality of substrate retaining units are arranged; retainers provided on the respective substrate retaining units, each retainer including at least one movable retaining member movable relative to a respective one of the substrate retaining units, each retainer being configured to hold, by means of the movable retaining member, a respective one of a plurality of substrates corresponding to the plurality of substrate retaining units such that the plurality of substrates are arranged in the first direction; movable units provided on the respective substrate retaining units, each movable unit being movable in a second direction and a third direction, the second direction crossing the first direction, the third direction being opposite to the second direction, each movable unit being configured to cause the at least one movable retaining member to move in accordance with the movement of the movable unit; urging mechanisms provided for the respective substrate retaining units and configured to urge the movable units in the second direction to cause the movable retaining members to come into contact with the substrates and press-hold the substrates; and a push back mechanism including a push back portion, the push back mechanism being configured such that the push back portion causes the movable units, which are provided on the respective substrate retaining units, to move in the third direction resisting against urging force of the urging by the urging mechanisms to release the press-holding of the substrates by the movable retaining members. The push back mechanism is configured to position the push back portion at a standby position, at which the push back portion makes no contact with the movable units.

According to the above configuration, the urging mechanisms are provided for the plurality of substrate retaining units, respectively, and capable of preventing the positional relationship between the substrate retaining units and their corresponding substrates from changing when a pitch change is performed. This makes it possible to keep the holding force constant at the time of performing the pitch change, and securely retain the substrates.

The pitch change can be performed when the push back portion is positioned at the standby position, at which the push back portion makes no contact with the movable units. Therefore, at the time of performing the pitch change, the push back portion and the movable units are prevented from rubbing against each other. This makes it possible to prevent particles from being generated when the pitch change is performed. Consequently, the yield of products manufactured by using the substrates can be improved.

In the substrate retaining device according to the present invention, the standby position may be away from a holding position in the second direction, and the holding position is such that the movable retaining members contact and press-hold the substrates.

According to this configuration, by moving the push back portion to be positioned away from the holding position in the second direction, the push back portion and the movable units can be rendered in a state where the push back portion and the movable units make no contact with each other.

In the substrate retaining device according to the present invention, each retainer may include at least one fixed retaining member fixed to a respective one of the substrate retaining units, and each retainer may be configured to hold the respective one of the plurality of substrates corresponding to the plurality of substrate retaining units by means of the fixed retaining member and the movable retaining member.

According to the above configuration, the respective one of the substrates can be held by the at least one fixed retaining member and the at least one movable retaining member.

In the substrate retaining device according to the present invention, two or more of the movable retaining members may be provided on each of the substrate retaining units.

According to the above configuration, the respective one of the substrates can be held by the two or more movable retaining members.

In the substrate retaining device according to the present invention, the urging mechanisms may include an urging limit position, which is away from the holding position in the second direction and at which the application of the urging force to the movable units in the second direction is released, and the standby position may be positioned away from the urging limit position in the second direction.

According to the above configuration, by moving the push back mechanism to be positioned away from the urging limit position in the second direction, the push back portion and the movable units can be rendered in a state where the push back portion and the movable units make no contact with each other, regardless of whether the retainers are retaining the substrates or not.

The substrate retaining device according to the present invention may include stoppers configured to restrict movement of the movable units in the second direction. The stoppers may define the urging limit position.

According to the above configuration, by moving the push back mechanism to be positioned away from the stoppers in the second direction, the push back portion and the movable units can be rendered in a state where the push back portion and the movable units make no contact with each other, regardless of whether the retainers are retaining the substrates or not.

In the substrate retaining device according to the present invention, the support mechanism may be configured to change the pitch in the first direction, at which the plurality of substrate retaining units are arranged, when the push back portion of the push back mechanism is positioned at the standby position.

According to the above configuration, the push back portion and the movable units can be prevented from rubbing against each other.

Advantageous Effects of Invention

The present invention is configured as described above, and provides advantageous effects of being able to keep the holding force constant and securely retain the substrates. The present invention also provides an advantageous effect of being able to improve the yield of products manufactured by using the substrates.

DESCRIPTION OF EMBODIMENTS

Figure 1:
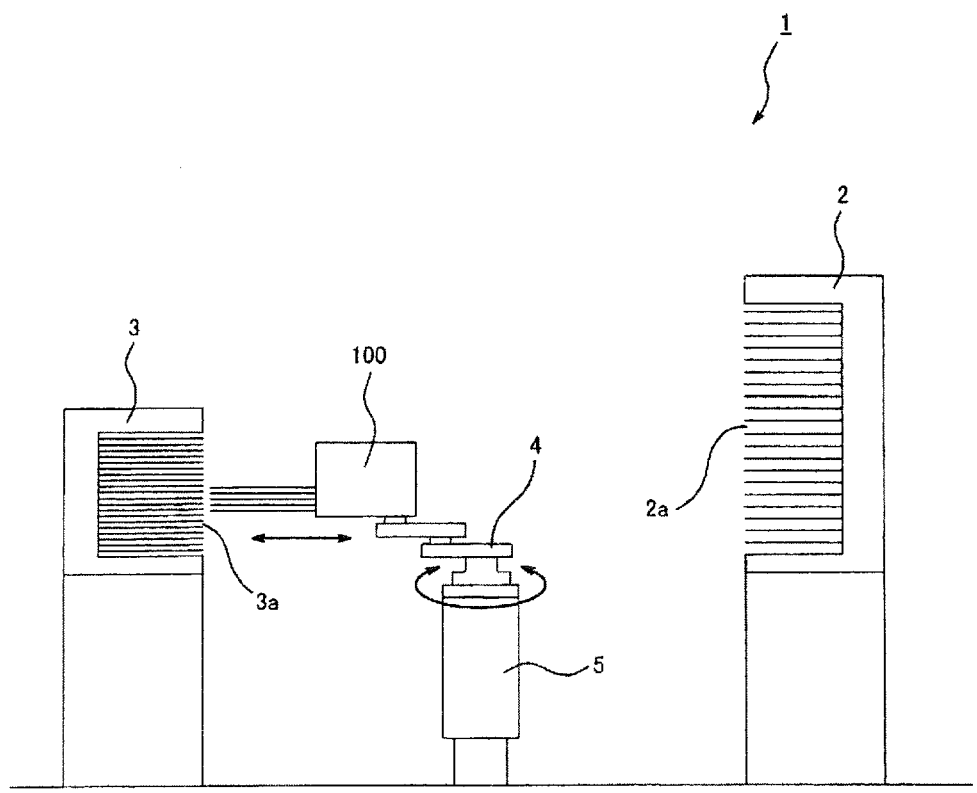
FIG. 1 shows an example of the configuration of a substrate conveyance system including a substrate retaining device according to one embodiment of the present invention.

Hereinafter, one embodiment of the present invention is described with reference to the accompanying drawings. In the drawings, the same or corresponding elements are denoted by the same reference signs, and repeating the same descriptions is avoided below.

Overall Configuration

FIG. 1 shows an example of the configuration of a substrate conveyance system 1 including a substrate retaining device 100.

Examples of the substrate herein include a semiconductor wafer and a glass substrate for a slim display (e.g., a liquid crystal display or organic EL display) that are processed by semiconductor processing. Examples of the semiconductor wafer include a silicon wafer, a silicon carbide wafer, and a sapphire wafer.

The substrate conveyance system 1 is not limited to a particular type of system, so long as the system is configured to convey substrates. The substrate conveyance system 1 is, for example, a system configured to convey silicon wafer substrates from one cassette to another cassette on a semiconductor production line. The substrate conveyance system 1 according to the present embodiment is configured to carry round substrates out of a first cassette 2, and then carry the substrates into a second cassette 3. The first cassette 2 and the second cassette 3 are both box-shaped. An opening 2a and an opening 3a, through which the carrying-in and carrying-out of the substrates stored in these cassettes are performed, are formed in the side of the first cassette 2 and the side of the second cassette 3, respectively. The first cassette 2 and the second cassette 3 are disposed such that the openings 2a and 3a face each other. In the first cassette 2, supports (not shown) support the substrates such that the substrates are arranged at a pitch P1 in, for example, the vertical direction. Similarly, in the second cassette 3, supports (not shown) support the substrates such that the substrates are arranged in the vertical direction at a pitch P2, which is less than the first pitch P1.

The substrate conveyance system 1 includes: a robot 4 with the substrate retaining device 100 installed at its distal end, the robot 4 being configured to convey substrates stored in the first cassette 2 to the second cassette 3 by using the substrate retaining device 100; a lifting/lowering base 5 configured to lift and lower the robot 4; and a controller (not shown) configured to control the robot 4 including the substrate retaining device 100, and control the lifting/lowering base 5.

The robot 4 is an industrial robot, for example. The substrate retaining device 100 is installed at the distal end of an arm of the robot. In the present embodiment, the robot 4 is a so-called horizontally articulated robot, and the arm is configured to move in a horizontal plane. Since the robot 4 can be configured as a well-known horizontally articulated robot, further description of the robot 4 is omitted.

The lifting/lowering base 5 is connected to the base of the robot 4, and is lifted and lowered in a direction crossing the horizontal plane in which the arm of the robot 4 moves. The lifting/lowering base 5 according to the present embodiment is disposed between the first cassette 2 and the second cassette 3, and is lifted and lowered in the vertical direction in which the substrates stored in these cassettes are arranged. Since the configuration of the lifting/lowering base 5 is well known, further description thereof is omitted.

Configuration of Substrate Retaining Device

Figure 2:
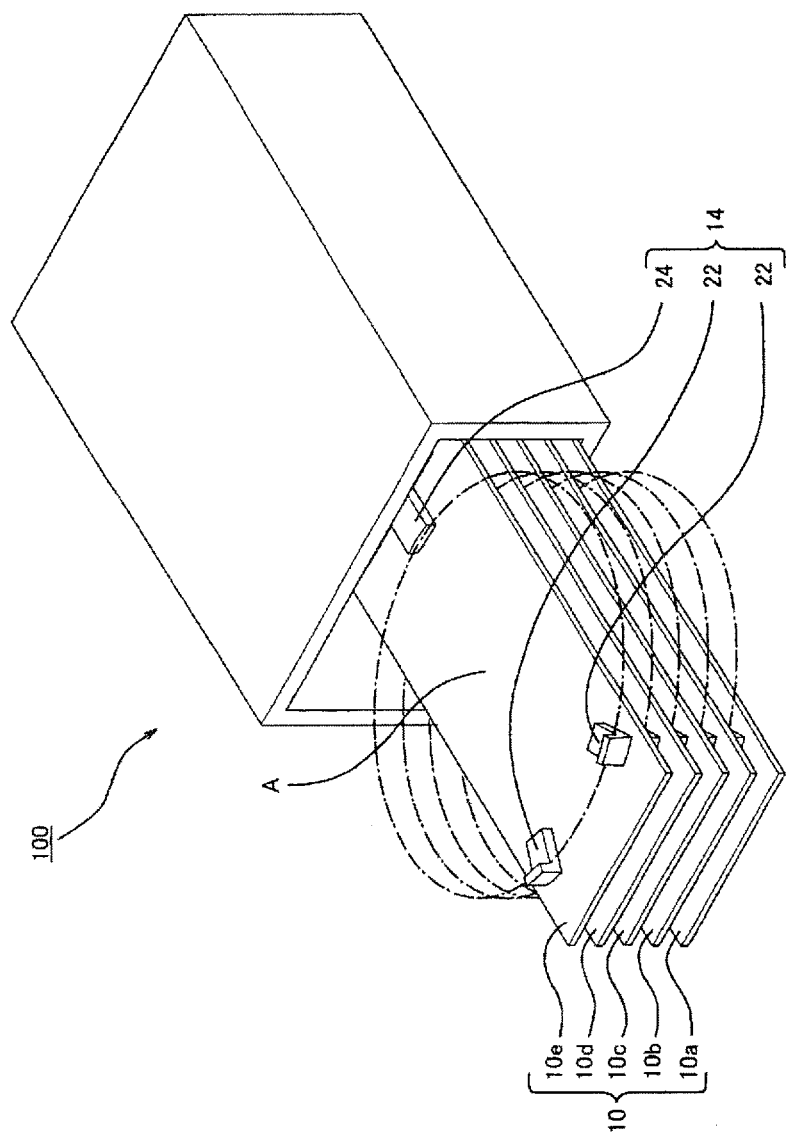
FIG. 2 is an external view showing an example of the configuration of the substrate retaining device of FIG. 1.
Figure 3:
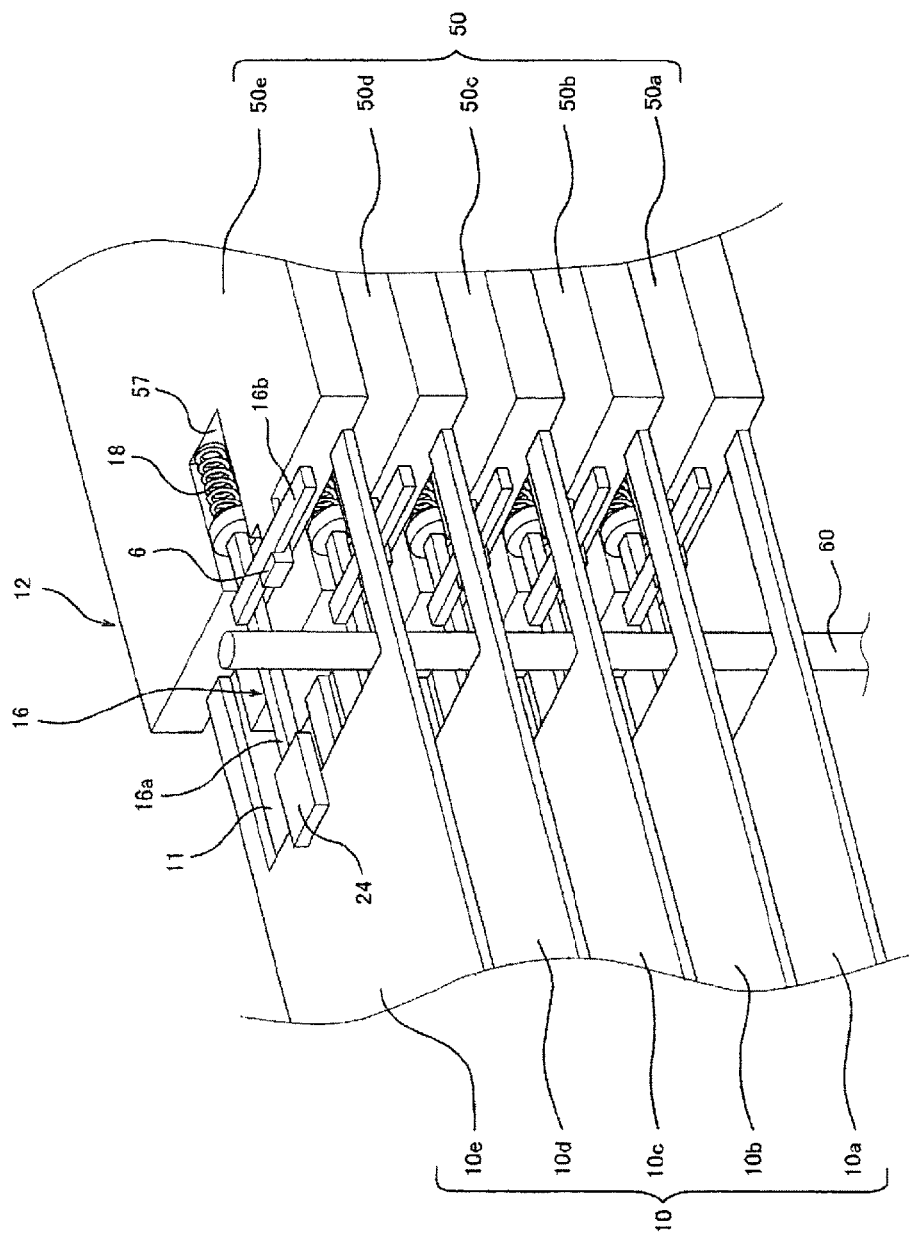
FIG. 3 is an essential-part enlarged perspective view showing an example of the configuration of the substrate retaining device of FIG. 1.

FIG. 2 is an external view showing an example of the configuration of the substrate retaining device 100. FIG. 3 is an essential-part enlarged perspective view showing an example of the configuration of the substrate retaining device 100. FIG. 3 shows the vicinity of proximal end portions of respective substrate retaining units 10, which will be described below.

As shown in FIG. 2 and FIG. 3, the substrate retaining device 100 includes: a plurality of substrate retaining units 10; a support mechanism 12 configured to support the proximal end portions of the respective substrate retaining units 10; retainers 14 configured to hold substrates; movable units 16; urging mechanisms 18; and a push back mechanism 20. In the present embodiment, five substrate retaining units 10, i.e., substrate retaining units 10a to 10e, are provided.

Figure 4:
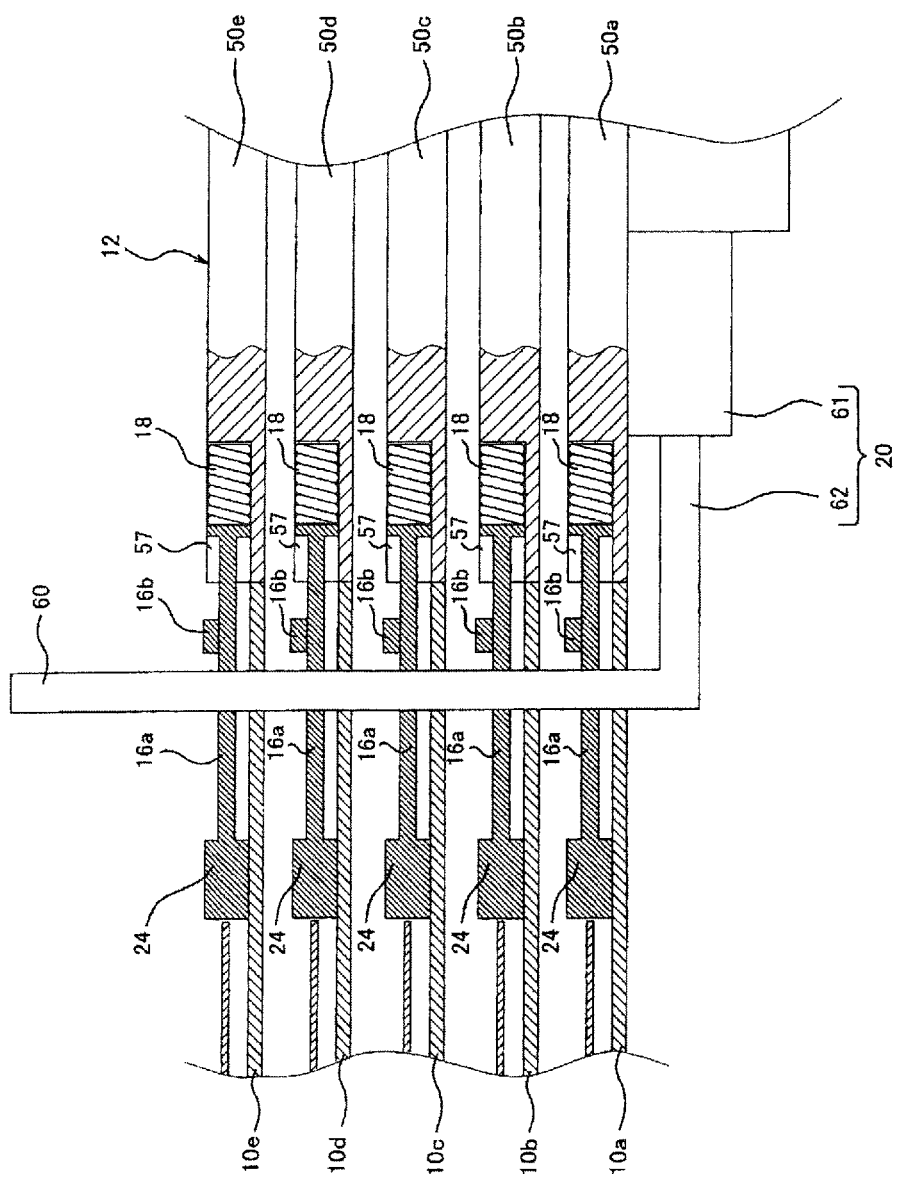
FIG. 4 is a side view showing an example of the configuration of the substrate retaining device of FIG. 1.

FIG. 4 is a side view showing an example of the configuration of the substrate retaining device 100. It should be noted that FIG. 4 shows a state where a push back portion 60 is positioned away from a standby position, which will be described below, toward the distal ends of the substrate retaining units 10.

As shown in FIG. 2, in the present embodiment, each of the substrate retaining units 10a to 10e is plate-shaped and extends from its proximal end portion to its distal end portion. A substrate-retaining position A, at which a round silicon wafer is to be retained, is set on each substrate retaining unit. The position A is set so as to extend from the middle portion to the distal end portion of each substrate retaining unit. As shown in FIG. 2 and FIG. 3, the middle of the proximal end portion of each of the substrate retaining units 10a to 10e is cut away, such that the cutting is made from the proximal end in a direction toward the distal end of each substrate retaining unit, and thus a notch 11 is formed. It should be noted that, in the description below, for the sake of convenience of the description, the direction from the proximal end side toward the distal end side of the substrate retaining units 10a to 10e is referred to as forward, and the opposite direction is referred to as rearward.

As shown in FIG. 3 and FIG. 4, the support mechanism 12 is configured to support the substrate retaining units 10a to 10e, such that the substrate retaining units 10a to 10e are arranged in their thickness direction, and change the pitches between the substrate retaining units 10a to 10e in their arrangement direction. In the present embodiment, the substrate retaining units 10a to 10e are configured to be arranged in the vertical direction (first direction). It should be noted that, in the description below, for the sake of convenience of the description, a direction from the substrate retaining unit 10a toward the substrate retaining unit 10e is referred to as upward, and the opposite direction is referred to as downward.

Figure 5A:
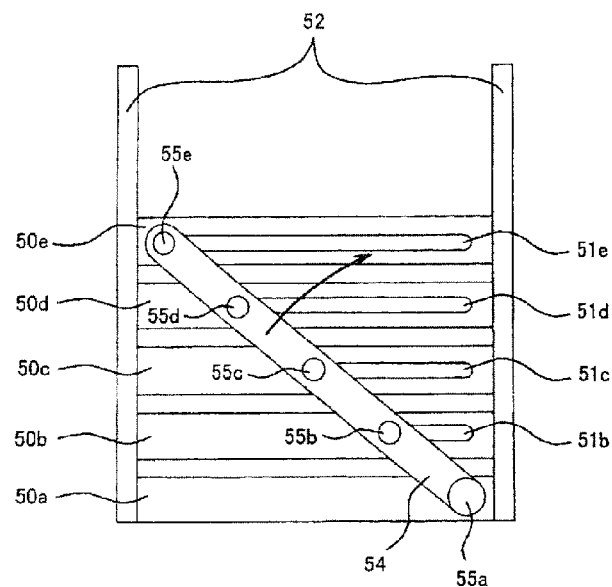
FIG. 5A shows an example of the configuration of a support mechanism of the substrate retaining device of FIG. 1.
Figure 5B:
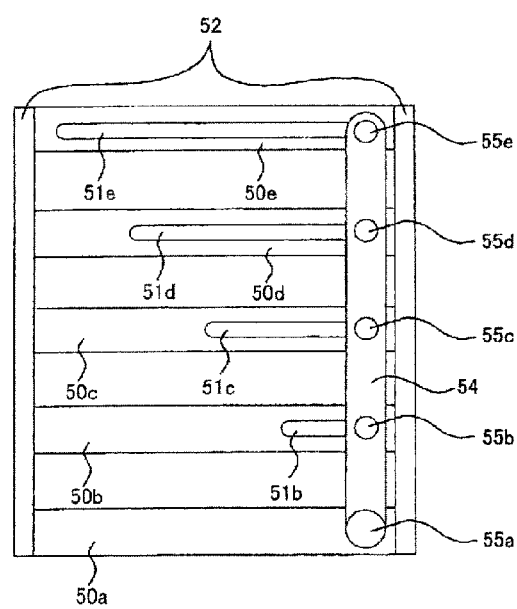
FIG. 5B shows the example of the configuration of the support mechanism of the substrate retaining device of FIG. 1.

FIG. 5A and FIG. 5B each show an example of the configuration of the support mechanism 12 of the substrate retaining device 100.

As shown in FIG. 3, FIG. 5A, and FIG. 5B, in the present embodiment, the support mechanism 12 includes: the same number of support bases as the number of substrate retaining units 10, i.e., five support bases (first to fifth support bases 50a to 50e); a pair of guide rails 52; a rotating member 54; and a pitch-change driver, which is not shown.

Each of the first to fifth support bases 50a to 50e is formed in the shape of a thick plate. Each support base has a surface (upper main face) and peripheral faces extending downward from the periphery of the surface. The peripheral faces include a front face, a rear face, and side faces. The rear ends of the substrate retaining units 10a to 10e are attached to the front faces of the first to fifth support bases 50a to 50e, respectively, such that the substrate retaining units 10a to 10e extend in a direction parallel to a direction in which the surfaces of the first to fifth support bases 50a to 50e extend.

As shown in FIG. 3, guide grooves 57 are formed in the surfaces of the first to fifth support bases 50a to 50e. The guide grooves 57 guide unit bodies 16a of the movable units 16, which will be described below. The guide grooves 57 extend forward from the inside of the surfaces of the support bases in a direction parallel to the direction in which the substrate retaining units 10 extend. The distal ends of the guide grooves 57 are open at the front faces of the first to fifth support bases 50a to 50e.

As shown in FIG. 5A and FIG. 5B, elongated holes 51b to 51e are formed in the rear faces of the second to fifth support bases 50b to 50e, respectively. The elongated holes 51b to 51e extend in a direction parallel to the direction in which the surfaces of the second to fifth support bases 50b to 50e extend. Engagement pins 55b to 55e, which will be described below, are in engagement with the elongated holes 51b to 51e, respectively.

Further, in the present embodiment, as shown in FIG. 3 and FIG. 4, the first to fifth support bases 50a to 50e include respective stoppers 6. The stoppers 6 restrict movement of levers 16b of the movable units 16, which will be described below. The stoppers 6 are formed to protrude forward from the front faces of the first to fifth support bases 50a to 50e, and are L-shaped when seen in side view. The stoppers 6 are arranged such that the stoppers 6 come into contact with the levers 16b of the movable units 16 when the movable units 16 are positioned at a urging limit position, which will be described below.

The pair of guide rails 52 extends in an up-down direction. The lower ends of the guide rails 52 are fixed to both side faces of the first support base 50a, respectively. In addition, the guide rails 52 are slidably in engagement with both side faces, respectively, of each of the second to fifth support bases 50b to 50e. The pair of guide rails 52 guides the second to fifth support bases 50b to 50e in the direction in which the guide rails 52 extend, i.e., in the up-down direction, while keeping the orientation of the second to fifth support bases 50b to 50e.

The rotating member 54 is, for example, a long and narrow plate-shaped member. The rotating member 54 is provided with the same number of engagement pins 55 as the number of substrate retaining units 10. The engagement pins 55 are arranged at regular intervals from the proximal end portion to the distal end portion of the rotating member 54. In the present embodiment, five engagement pins 55a to 55e are provided. Among the engagement pins 55a to 55e, the engagement pin 55a is rotatably engaged with the first support base 50a. The other engagement pins 55b to 55e are engaged with the elongated holes 51b to 51e, respectively, and are configured to be slidable in the direction in which the elongated holes 51 extend.

The pitch-change driver is connected to the engagement pin 55a, and causes the engagement pin 55a and the rotating member 54 to rotate together.

In the support mechanism 12 configured as described above, when the pitch-change driver causes the rotating member 54 to swing, since the rotating member 54 is positioned in a manner to cross the direction in which the elongated holes 51b to 51e extend, the second to fifth support bases 50b to 50e are guided in the up-down direction in which the pair of guide rails 52 extends. Moreover, since the five engagement pins 55a to 55e are arranged at regular intervals, the first to fifth support bases 50a to 50e are arranged at regular intervals whatever the pitch is.

As shown in FIG. 2 to FIG. 4, the retainers 14 are provided on the substrate retaining units 10a to 10e, respectively. Each retainer 14 includes a movable retaining member 24. The movable retaining members 24 are movable relative to the substrate retaining units 10a to 10e, respectively. In the present embodiment, each retainer 14 further includes two fixed retaining members 22.

The movable retaining member 24 is provided on each of the substrate retaining units 10 so as to be positioned on a rear peripheral portion positioned at the rear of the substrate-retaining position A. The two fixed retaining members 22 are provided on each of the substrate retaining units 10a to 10e so as to be positioned on a front peripheral portion positioned at the front of the substrate-retaining position A. Each substrate corresponding to the respective substrate retaining unit 10 is held by the movable retaining member 24 and the fixed retaining members 22. As a result, the substrates are arranged in the up-down direction.

The movable units 16 are provided on the substrate retaining units 10a to 10e, respectively. The movable units 16 are movable in a direction crossing the up-down direction. With the movement, the movable units 16 cause the respective movable retaining members 24 to move.

In the present embodiment, each movable unit 16 includes: the unit body 16a, which is a rod-like body extending in a direction parallel to the direction in which the substrate retaining unit 10 extends; and the lever 16b, which extends in a direction crossing the direction in which the unit body 16a extends.

The unit bodies 16a are disposed in the guide grooves 57 of the first to fifth support bases 50a to 50e, respectively. Each unit body 16a is guided by the respective guide groove 57, and thereby slidingly moves in a direction toward the substrate-retaining position A, that is, forward (i.e., in a second direction), and also in a direction away from the substrate-retaining position A, that is, rearward (i.e., in a third direction). The front ends of the unit bodies 16a are integrally attached to the rear ends of the movable retaining members 24, respectively. Accordingly, the movable retaining members 24 move in the front-rear direction together with the movable units 16.

The levers 16b come into contact with the push back portion 60, which will be described below. The levers 16b extend in respective planes parallel to the direction in which the substrate retaining units 10 extend, and extend in a direction perpendicular to the direction in which the unit bodies 16a extend.

The urging mechanisms 18 urge the movable units 16 to cause the movable retaining members 24 to come into contact with the substrates positioned at the substrate-retaining positions A, thereby press-holding the substrates. Examples of the urging mechanisms 18 include various types of springs, motors, and pneumatic actuators.

In the present embodiment, the urging mechanisms 18 are compression coil springs. The urging mechanisms 18 urge forward the rear ends of the unit bodies 16a of the movable units 16 from behind. Accordingly, if the substrates are positioned at the substrate-retaining positions A, the movable retaining members 24 urged by the urging mechanisms 18 via the movable units 16 move forward to come into contact with the substrates, and press-hold the substrates.

On the other hand, if no substrates are positioned at the substrate-retaining positions A, the movable units 16 move further forward such that the levers 16b come into contact with the stoppers 6, and thereby the forward movement of the movable units 16 is restricted. In this manner, the application of the forward urging force to the movable retaining members 24 is released. The positions of the respective movable units 16 in such a state form an urging limit position (see FIG. 9). That is, the urging limit position is defined by the stoppers 6.

The push back mechanism 20 includes the push back portion 60. The push back portion 60 causes the movable units 16 to move rearward resisting against the urging force of the urging mechanisms 18, thereby releasing the press-holding of the substrates by the movable retaining members 24.

In the present embodiment, the push back mechanism 20 includes a push back driver 61 and a rod 62. The proximal end of the rod 62 is connected to the push back driver 61. The rod 62 is formed by bending a bar-like object into an L shape, and the distal end side with respect to the bent portion of the rod 62 serves as the push back portion 60. The push back portion 60 is formed to extend in the up-down direction, and is positioned inside the notches 11. The push back portion 60 is positioned forward of the levers 16b. The push back driver 61 is attached to the bottom of the first support base 50a. The push back driver 61 is an actuator configured to cause the push back portion 60 to advance or retract in the notches 11 between a front standby position (see FIG. 8) and a rear releasing position (see FIG. 7) in the direction in which the guide grooves 57 extend. A holding position, at which the push back portion 60 comes into contact with the levers 16b in a state where the movable retaining members 24 are in contact with the respective substrate-retaining positions A, is positioned between the standby position and the releasing position.

The standby position is set such that the standby position is positioned forward of the holding position (i.e., positioned away from the holding position in the second direction). Accordingly, when the push back portion 60 is moved from the holding position to the standby position, the movable retaining members 24 and the movable units 16 are urged by the urging mechanisms 18 to move forward. However, the forward movement is restricted by the substrates. Therefore, the movable retaining members 24 and the movable units 16 do not follow the movement of the push back portion 60. As a result, the push back portion 60 and the levers 16b are separated from each other, and thus rendered in a non-contacting state.

Figure 9:
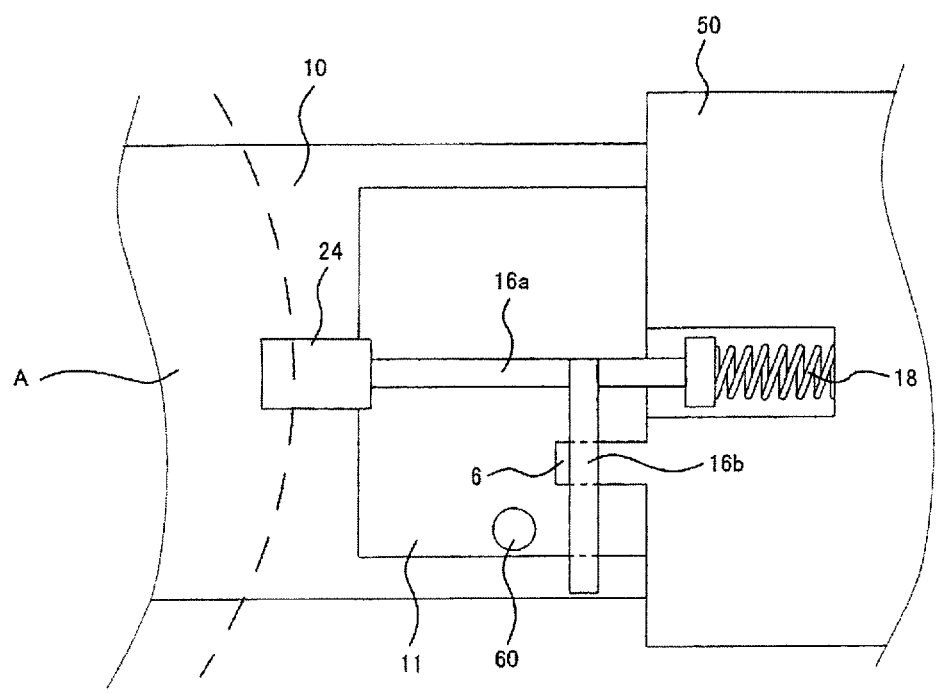
FIG. 9 shows the example of operations of the substrate retaining device of FIG. 1.

Further, in the present embodiment, the standby position is set such that the standby position is positioned forward of a position where the push back portion 60 comes into contact with the levers 16b of the movable units 16 positioned at the urging limit position (see FIG. 9). Accordingly, when the push back portion 60 is moved from the holding position to the standby position, forward movement of the movable retaining members 24 and the movable units 16 is restricted by the stoppers 6 even if no substrates are positioned at the substrate-retaining positions A. Therefore, the movable retaining members 24 and the movable units 16 do not follow the movement of the push back portion 60. As a result, the push back portion 60 and the levers 16b are separated from each other, and thus rendered in a non-contacting state.

As described above, the push back portion 60 is configured such that, at the standby position, the push back portion 60 makes no contact with the levers 16b regardless of whether the substrates are positioned at the substrate-retaining positions A or not.

The releasing position is set such that the releasing position is positioned rearward of the holding position (i.e., positioned away from the holding position in the third direction). Therefore, when the push back portion 60 is moved from the holding position to the releasing position, the movable retaining members 24 and the movable units 16 follow the movement of the push back portion 60, and thereby the movable retaining members 24 and the movable units 16 are pushed back rearward resisting against the urging force of the urging mechanisms 18. As a result, the press-holding of the substrates is released.

Example of Operation

Next, an example of operations of the substrate conveyance system 1 including the substrate retaining device 100 is described.

Figure 6:
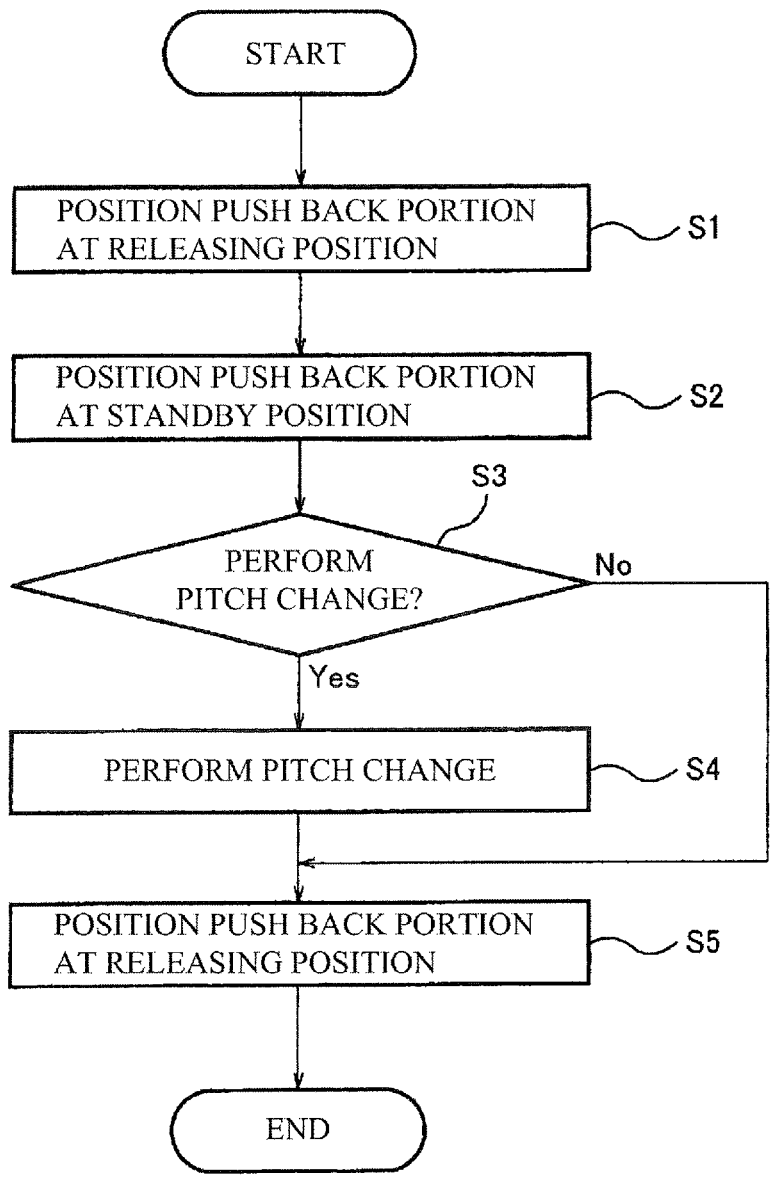
FIG. 6 is a flowchart showing an example of operations of the substrate retaining device of FIG. 1.
Figure 7:
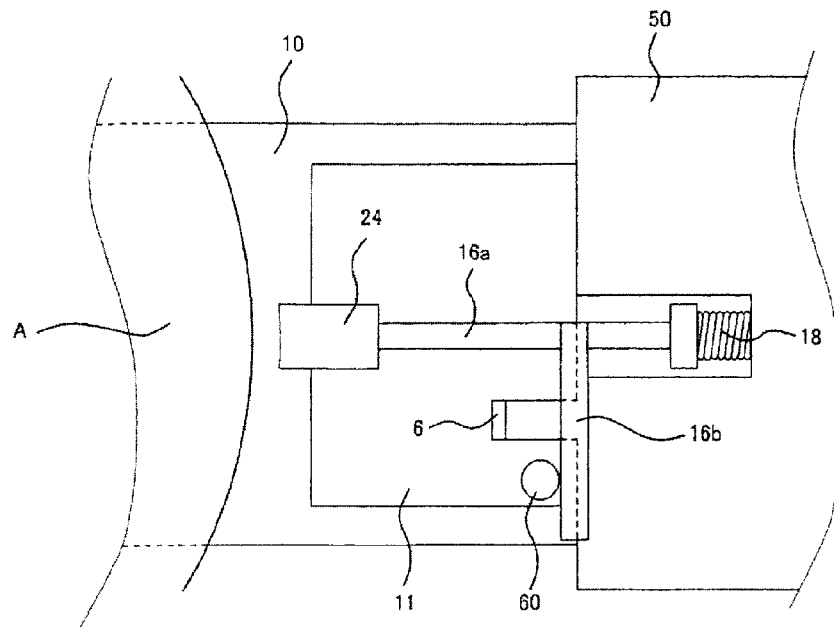
FIG. 7 shows the example of operations of the substrate retaining device of FIG. 1.
Figure 8:
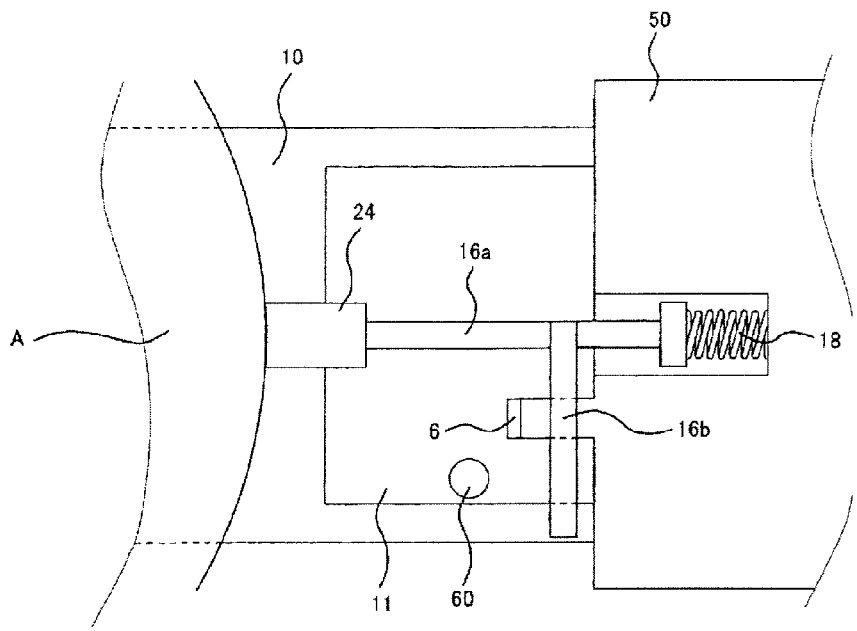
FIG. 8 shows the example of operations of the substrate retaining device of FIG. 1.

FIG. 6 is a flowchart showing an example of operations of the substrate retaining device 100. FIGS. 7 to 9 illustrate the example of operations of the substrate retaining device 100.

First, a controller of the substrate conveyance system 1 causes the substrate retaining units 10 to be positioned such that the pitch at which the five substrate retaining units 10 are arranged becomes the first pitch P1, which is the same as the pitch at which the substrates stored in the first cassette 2 are arranged, and the controller causes the push back portion 60 to be positioned at the releasing position as shown in FIG. 7 (step S1).

Next, the controller of the substrate conveyance system 1 drives the lifting/lowering base 5 to position the substrate retaining units 10 of the substrate retaining device 100 at respective height positions where the substrate retaining units 10 can be inserted into gaps between the substrates stored in the first cassette 2. The controller of the substrate conveyance system 1 then drives the robot 4 to insert the substrate retaining units 10 of the substrate retaining device 100 into the gaps between the substrates stored in the first cassette 2 via the opening 2a of the first cassette 2, and causes the substrates to be positioned at the substrate-retaining positions A of the substrate retaining units 10.

Next, as shown in FIG. 8, the controller of the substrate conveyance system 1 causes the push back portion 60 to be positioned at the standby position (step S2). During this step, the movable retaining members 24 are urged by the urging force of the urging mechanisms 18 to come into contact with the substrates positioned at the substrate-retaining positions A, and press-hold the substrates.

It should be noted that if no substrate is stored in the first cassette 2, the movable units 16 are positioned to the urging limit position as shown in FIG. 9.

Next, the controller of the substrate conveyance system 1 drives the lifting/lowering base 5 and the robot 4 to draw the substrate retaining device 100 to the outside of the first cassette 2, thereby carrying the substrates out of the first cassette 2. Then, if the first pitch P1 of the first cassette 2 and the second pitch P2 of the second cassette 3 are different from each other as in the present embodiment, the controller of the substrate conveyance system 1 determines to perform a pitch change (YES in step S3). Subsequently, the controller of the substrate conveyance system 1 drives the pitch-change driver to perform the pitch change, which is an operation of positioning the substrate retaining units 10 such that the pitch at which the five substrate retaining units 10 are arranged becomes the second pitch P2, which is the same as the pitch at which the substrates in the second cassette 3 are arranged (step S4).

In accordance with the pitch change, the levers 16b move in a direction parallel to the direction in which the push back portion 60 extends. However, since the push back portion 60 is in a non-contacting state where the push back portion 60 makes no contact with the levers 16b, the push back portion 60 and the levers 16b do not rub against each other. Thus, particles are prevented from being generated.

On the other hand, if the first pitch P1 of the first cassette 2 and the second pitch P2 of the second cassette 3 are the same, the controller of the substrate conveyance system 1 determines not to perform a pitch change (NO in step S3). As a result, no pitch change is performed.

Next, the controller of the substrate conveyance system 1 drives the lifting/lowering base 5 to position the substrate retaining units 10 of the substrate retaining device 100 at respective height positions where the substrate retaining units 10 can be inserted into gaps between the substrates stored in the second cassette 3. The controller of the substrate conveyance system 1 then drives the robot 4 to insert the substrate retaining units 10 of the substrate retaining device 100 into second cassette 3 via the opening 3a of the second cassette 3, thereby carrying the substrates into the second cassette 3. The controller of the substrate conveyance system 1 then causes the push back portion 60 to be positioned at the releasing position to release the press-holding of the substrates, and causes the substrates to be supported by the supports in the second cassette 3, and thereby the carrying-in of the substrates into the second cassette 3 is competed.

As described above, the substrate retaining device 100 according to the present embodiment is configured such that the urging mechanisms 18 provided for the the substrate retaining units 10 each individually push the substrate that is positioned at the substrate-retaining position A of the corresponding substrate retaining unit 10. This makes it possible to keep the substrate-holding force constant even if the pitch change has been performed.

Further, the generation of particles, which is caused when the push back portion 60 and the levers 16b rub against each other, can be prevented at the time of performing the pitch change since the push back portion 60 can be positioned to the standby position where the push back portion 60 makes no contact with the levers 16b. This makes it possible to improve the yield of products manufactured by using the substrates.

Still further, the substrate retaining device 100 is configured to perform the press-holding of a plurality of substrates at one time, and also release the press-holding of the plurality of substrates at one time, by changing the positions of the push back portion 60. This makes it possible to simplify the configuration of the substrate retaining device 100, which brings advantages in terms of the manufacturing of the substrate retaining device 100, and reduces the manufacturing costs.

Variation

Figure 10:
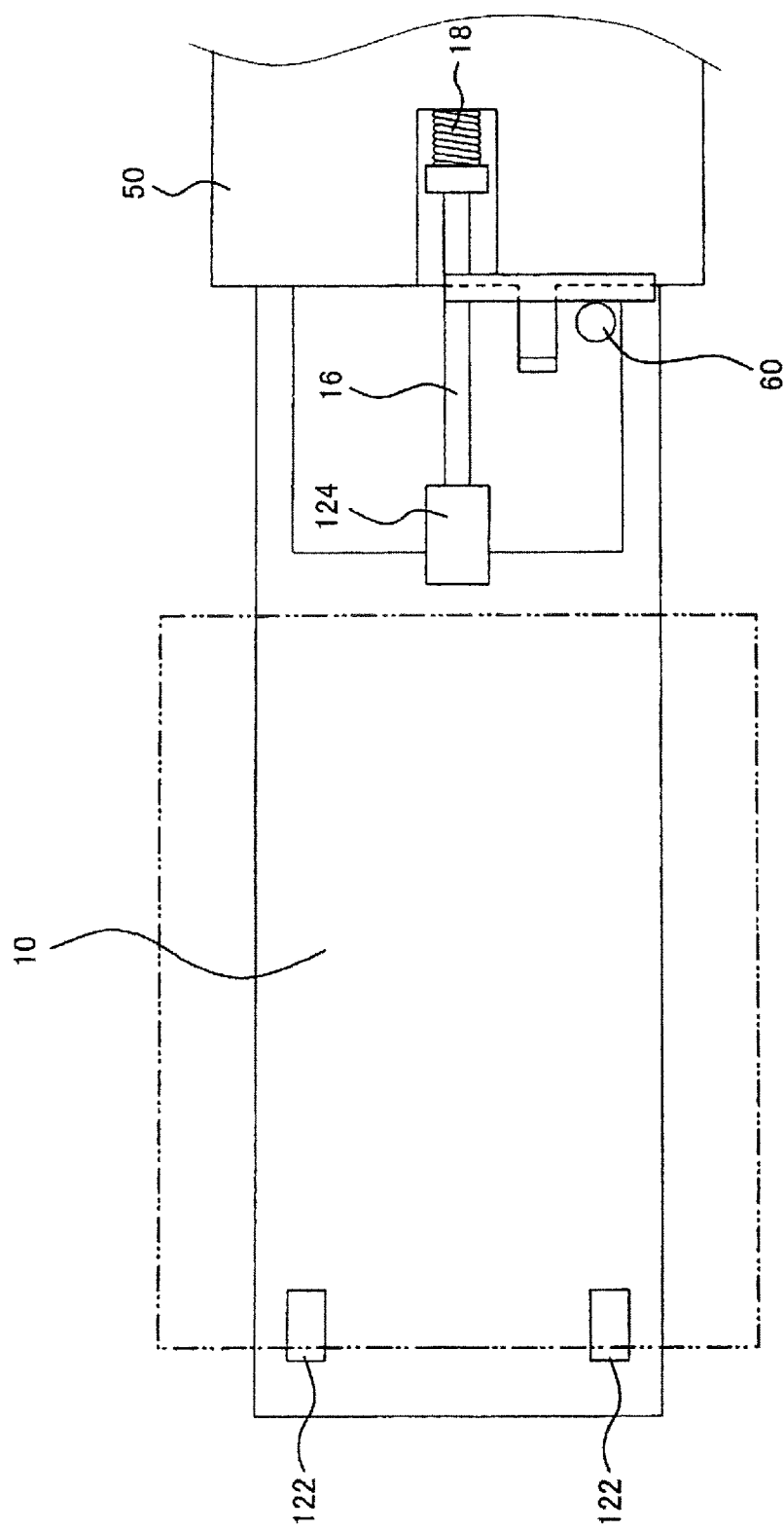
FIG. 10 shows a variation of the substrate retaining device according to the embodiment of the present invention.

In the above-described embodiment, the substrate retaining device 100 is configured to hold each round substrate with the movable retaining member 24 and the two fixed retaining members 22. However, the present embodiment is not thus limited. As an alternative, for example, as shown in FIG. 10, the substrate retaining device 100 may be configured to hold rectangular substrates. In addition, each of such rectangular substrates may be held by a movable retaining member 124 and fixed retaining members 122, the movable retaining member 124 and the fixed retaining members 122 facing each other.

Although in the above-described embodiment each retainer 14 includes the movable retaining member 24 and the fixed retaining members 22, the configuration of the retainer 14 is not thus limited. As an alternative, for example, each retainer 14 may include only a plurality of movable retaining members 24 as retaining members.

Although in the above-described embodiment the stoppers 6 define the urging limit position of the movable units 16, the present embodiment is not thus limited. As an alternative, the stoppers 6 may be eliminated, and the positions of the movable units 16 when the coil springs of the urging mechanisms 18 have reached their free length may define the urging limit position.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

INDUSTRIAL APPLICABILITY

The substrate retaining device according to the present invention is useful when applied to a production line of semiconductors, display panels, or the like, in which fine circuits are formed on substrates.

REFERENCE SIGNS LIST 1 substrate conveyance system
2 first cassette
2a opening
3 second cassette
3a opening
4 robot
5 lifting/lowering base
6 stopper
10 substrate retaining unit
11 notch
12 support mechanism
14 retainer
16 movable unit
16a unit body
16b lever
18 urging mechanism
20 push back mechanism
22 fixed retaining member
24 movable retaining member
50 support base
51 elongated hole
52 guide rail
54 rotating member
55 engagement pin
57 guide groove
60 push back portion
61 push back driver
62 rod
100 substrate retaining device

The invention claimed is:

1. A substrate retaining device comprising:
a plurality of substrate retaining units;
a support mechanism configured to support the plurality of substrate retaining units such that the substrate retaining units are arranged in a first direction, and change a pitch in the first direction at which the plurality of substrate retaining units are arranged;
retainers provided on the respective substrate retaining units,
each retainer including at least one movable retaining member movable relative to a respective one of the substrate retaining units, each retainer being configured to hold, by means of the movable retaining member, a respective one of a plurality of substrates corresponding to the plurality of substrate retaining units such that the plurality of substrates are arranged in the first direction;
movable units provided on the respective substrate retaining units,
each movable unit being movable in a second direction and a third direction, the second direction crossing the first direction, the third direction being opposite to the second direction,
each movable unit being configured to cause the at least one movable retaining member to move in accordance with the movement of the movable unit;
spring urging mechanisms provided for the respective substrate retaining units and configured to urge the movable units in the second direction to cause the movable retaining members to come into contact with the substrates and press-hold the substrates; and
a push back mechanism including a push back portion, the push back mechanism being configured such that the push back portion causes the movable units, which are provided on the respective substrate retaining units, to move in the third direction resisting against urging force of the urging by the spring urging mechanisms to release the press-holding of the substrates by the movable retaining members, wherein
the push back mechanism is configured to position the push back portion at a standby position, at which the push back portion makes no contact with the movable units, and
the push back portion is disposed between the spring urging mechanisms and the retainers.

2. The substrate retaining device according to claim 1, wherein
the standby position is away from a holding position in the second direction, and
the holding position is such that, when the push back portion is positioned at the holding position, the movable retaining members contact and press-hold the substrates.

3. The substrate retaining device according to claim 1, wherein each retainer includes at least one fixed retaining member fixed to a respective one of the substrate retaining units, and each retainer is configured to hold the respective one of the plurality of substrates corresponding to the plurality of substrate retaining units by means of the fixed retaining member and the movable retaining member.

4. The substrate retaining device according to claim 1, wherein two or more of the movable retaining members are provided on each of the substrate retaining units.

5. The substrate retaining device according to claim 1, wherein the spring urging mechanisms include an urging limit position, which is away from the holding position in the second direction and at which the application of the urging force to the movable units in the second direction is released, and the standby position is positioned away from the urging limit position in the second direction.

6. The substrate retaining device according to claim 5, comprising stoppers configured to restrict movement of the movable units in the second direction, wherein the stoppers define the urging limit position.

7. The substrate retaining device according to claim 1, wherein the support mechanism is configured to change the pitch in the first direction, at which the plurality of substrate retaining units are arranged, when the push back portion of the push back mechanism is positioned at the standby position.

\* \* \* \* \*